(12) United States Patent
Miyamoto et al.

(10) Patent No.: US 7,384,811 B2
(45) Date of Patent: Jun. 10, 2008

(54) METHOD OF SEPARATING SEMICONDUCTOR WAFER, AND SEPARATING APPARATUS USING THE SAME

(75) Inventors: Saburo Miyamoto, Mie-ken (JP); Yukitoshi Hase, Mie-ken (JP)

(73) Assignee: Nitto Denko Corporation, Osaka (JP)

( * ) Notice: Subject to any disclaimer, the term of this patent is extended or adjusted under 35 U.S.C. 154(b) by 34 days.

(21) Appl. No.: 10/938,645

(22) Filed: Sep. 13, 2004

(65) Prior Publication Data

US 2005/0074952 A1    Apr. 7, 2005

(30) Foreign Application Priority Data

Oct. 6, 2003    (JP)    ............................. 2003-347059

(51) Int. Cl.
*H01L 21/00*    (2006.01)
*H01L 21/46*    (2006.01)

(52) U.S. Cl. ..................... 438/33; 438/113; 438/458; 438/459; 438/460

(58) Field of Classification Search ..................... None
See application file for complete search history.

(56) References Cited

U.S. PATENT DOCUMENTS

| | | | | |
|---|---|---|---|---|
| 5,169,196 A | * | 12/1992 | Safabakhsh .................. 294/64.3 |
| 5,425,833 A | * | 6/1995 | Fujimoto et al. ............. 156/344 |
| 6,066,887 A | * | 5/2000 | Hong et al. ................... 257/668 |
| 6,142,356 A | * | 11/2000 | Yamazaki et al. ............ 228/6.2 |
| 6,319,754 B1 | * | 11/2001 | Wang et al. .................. 438/113 |
| 6,451,671 B1 | * | 9/2002 | Yamada ........................ 438/460 |
| 6,534,382 B1 | * | 3/2003 | Sakaguchi et al. ........... 438/455 |
| 6,558,975 B2 | * | 5/2003 | Sugino et al. ................. 438/64 |
| 6,582,223 B2 | * | 6/2003 | Yasumura et al. ........... 432/258 |
| 6,627,037 B1 | | 9/2003 | Kurokawa et al. |
| 6,629,553 B2 | * | 10/2003 | Odashima et al. ........... 156/584 |
| 6,979,593 B2 | * | 12/2005 | Kawakami .................... 438/110 |
| 2001/0036711 A1 | * | 11/2001 | Urushima .................... 438/460 |
| 2001/0055837 A1 | * | 12/2001 | Jiang et al. .................. 438/118 |
| 2002/0072202 A1 | * | 6/2002 | Odashima et al. ........... 438/460 |
| 2002/0106869 A1 | * | 8/2002 | Otsu et al. .................... 438/459 |
| 2002/0129899 A1 | * | 9/2002 | Mimata et al. .............. 156/344 |

(Continued)

FOREIGN PATENT DOCUMENTS

JP    360216567    * 10/1985

(Continued)

OTHER PUBLICATIONS

European Search Report mailed on Jul. 14, 2005.

(Continued)

*Primary Examiner*—Carl Whitehead, Jr.
*Assistant Examiner*—James M Mitchell
(74) *Attorney, Agent, or Firm*—Cheng Law Group PLLC

(57) ABSTRACT

With respect to a work obtained by joining a semiconductor wafer and a supporting member to each other via a both-faced adhesive sheet having heating separability, the surface of the supporting member is suction-held at a suction stage and is heated, thereby making the adhesive strength of an adhesive layer almost disappear. A Bernoulli chuck is moved close from the back side of the semiconductor wafer to separate the semiconductor wafer in a non-contact manner and to suspension-hold the semiconductor wafer in a state where the semiconductor wafer floats in the air.

10 Claims, 2 Drawing Sheets

U.S. PATENT DOCUMENTS

| | | | |
|---|---|---|---|
| 2002/0149114 A1* | 10/2002 | Soga et al. | 257/772 |
| 2003/0060021 A1* | 3/2003 | Kurosawa et al. | 438/455 |
| 2003/0173017 A1 | 9/2003 | Hecht et al. | |
| 2003/0178864 A1* | 9/2003 | Thallner | 294/64.3 |
| 2003/0190823 A1* | 10/2003 | Keeton et al. | 438/795 |
| 2003/0203547 A1* | 10/2003 | Sakaguchi et al. | 438/151 |
| 2003/0207516 A1* | 11/2003 | Tan et al. | 438/200 |
| 2004/0063251 A1* | 4/2004 | Ootsuka et al. | 438/119 |
| 2004/0089515 A1* | 5/2004 | Yoo | 198/438 |
| 2004/0102030 A1* | 5/2004 | Narita et al. | 438/613 |
| 2005/0056946 A1* | 3/2005 | Gilleo | 257/783 |

FOREIGN PATENT DOCUMENTS

| | | | |
|---|---|---|---|
| JP | 03069112 | * | 3/1991 |
| JP | 2001-007179 A1 | | 1/2001 |
| WO | WO-02/27764 A1 | | 4/2002 |
| WO | WO-03/001587 A2 | | 1/2003 |

OTHER PUBLICATIONS

Chinese Office Action for corresponding Application No. 2004100834438 dated Jul. 27, 2007 (7 pages).

* cited by examiner

METHOD OF SEPARATING SEMICONDUCTOR WAFER, AND SEPARATING APPARATUS USING THE SAME

BACKGROUND OF THE INVENTION (1) Field of the Invention

The present invention relates to a method of separating a semiconductor wafer held by being joined to a supporting member such as a glass plate via a double-faced adhesive sheet from the supporting member, and to a separating apparatus using the method.

(2) Description of the Related Art

Generally, a semiconductor wafer is subjected to a process of forming a number of devices on the surface of the semiconductor wafer. After that, in a back grind process, the back face of the semiconductor wafer is ground or polished to a desired thickness. The resultant semiconductor wafer is diced into devices in a dicing process.

In resent years, with rapid progress of an application, reduction in thickness of a semiconductor wafer to 100 µm to 50 µm, in some occasions, even to 25 µm is demanded. Such a thin semiconductor wafer is brittle and easily distorted and its handling is extremely difficult. Consequently, the semiconductor wafer is held by being joined to the surface side of a supporting member having strength such as a glass plate via a both-faced adhesive sheet. After the semiconductor wafer is reinforced by backing with the supporting member as described above, the back grind process is performed on the back face of the semiconductor wafer, and the semiconductor wafer is separated from the supporting member.

Hitherto, means for separating a semiconductor wafer held by being joined to a supporting member via a both-faced adhesive sheet is performed as follows. A both-faced adhesive sheet of an ultraviolet curing type whose adhesive strength is weakened by irradiation with an ultraviolet ray is used. First, by irradiation with ultraviolet rays, the adhesive strength is preliminarily decreased. In the subsequent process, the semiconductor wafer is sandwiched by upper and lower two tables and heated in a vacuumed state so as to be shrink-deformed, thereby reducing the contact area between the both-faced adhesive sheet and the semiconductor wafer, and the semiconductor wafer is floated.

After completion of the shrinking and separation of the both-faced adhesive sheet, suction of the upper table is cancelled and the upper table is withdrawn to the upper side. After that, in a state where the semiconductor wafer is suction-fixed on the lower table, a holding member is sucked and moved by a transport arm, thereby separating the semiconductor wafer from the both-faced adhesive sheet. Such means is proposed and carried out (see, for example, JP-A 2001-7179).

As the both-faced adhesive sheet used, not only a both-faced adhesive sheet of the ultraviolet curing type but also a both-faced adhesive sheet having heating separability which foams when heated and whose adhesive strength decreases are used.

The conventional means has the following problems.

First, when a semiconductor wafer is sandwiched and suction-held, an almost vacuum state is obtained in the space. Therefore, after separating of the both-faced adhesive sheet is determined, when suction of the upper table is cancelled and the upper table is withdrawn to the upper side, the contact faces of the supporting member and the upper table are in a nearly vacuum state, so that negative pressure is generated on the contact faces of both of the members. It causes a problem of occurrence of a warp in the semiconductor wafer.

Second, the distribution of the adhesive strength largely varies according to conditions such as the degree of shrink deformation of the both-faced adhesive sheet, the degree of ultraviolet curing, and the like. When the semiconductor wafer which is suction-fixed on the lower table is lifted and moved by forcefully suction-holding the supporting member, local separating stress acts on the semiconductor wafer, and there is a possibility in that a warp or breakage occurs.

SUMMARY OF THE INVENTION

The present invention is made in consideration of the above circumstances, and it is a main object thereof to provide a semiconductor wafer separating method and apparatus capable of smoothly separating a semiconductor wafer held by being joined to a supporting member via a both-faced adhesive sheet without stress.

In order to achieve the above object, the present invention employs the following configuration:

A method for separating a semiconductor wafer joined to a supporting member via a both-faced adhesive sheet from the both-faced adhesive sheet, the method comprising:

a first step of weakening adhesive strength of the both-faced adhesive sheet for joining the semiconductor wafer and the supporting member to each other; and a second step of separating the semiconductor wafer from the both-faced adhesive sheet in a non-contact manner while weakening the adhesive strength of the both-faced adhesive sheet by separating means.

According to the semiconductor wafer separating method of the present invention, a semiconductor wafer is separated from the both-faced adhesive sheet in a non-contact manner, so that separating stress acting on the semiconductor wafer at the time of separating is small. At the time of separating the both-faced adhesive sheet whose adhesive strength is weakened, small separating stress acting so as to be dispersed to the periphery of the semiconductor wafer acts toward the center of the semiconductor wafer, so that the semiconductor wafer is separated from the outer end side of the both-faced adhesive sheet toward the center. Therefore, the stress caused by the separating on the semiconductor wafer can be reduced and the semiconductor wafer can be separated smoothly without stress while preventing warp and breakage of the semiconductor wafer.

In the semiconductor wafer separating method according to the present invention, in the first step, the supporting member is held in a posture that the surface of the supporting member faces downward, and in the second step, the semiconductor wafer is separated from the both-faced adhesive sheet while suspension-holding the semiconductor wafer in a non-contact manner by a differential pressure generated in a gap between the separating means and the back face of the semiconductor wafer by ejecting gas from the separating means toward the back face of the semiconductor wafer.

According to the method, the differential pressure from the atmospheric pressure is generated in the gap between the separating means and the back face of a semiconductor wafer by gas ejected toward the back face of the semiconductor wafer, and the semiconductor wafer is suspension-held in the space while maintaining a predetermined distance. Therefore, the semiconductor wafer can be separated in a state where warp stress on the semiconductor wafer generated in the back grinding process is spread and disappears, and transported as it is.

In the semiconductor wafer separating method according to the present invention, in the first step, the supporting member is held in a posture that the surface of the supporting member faces upward, and in the second step, the semiconductor wafer separated and dropped by dead load from the both-faced adhesive sheet whose adhesive strength is weakened is held.

According to the method, a semiconductor wafer is separated and naturally drops by dead load from the both-faced adhesive sheet whose adhesive strength is weakened, and the dropped semiconductor wafer can be properly received and held by transport means. In this case, the separating stress by the dead load of the semiconductor wafer acts from one end side of the both-faced adhesive sheet, and the semiconductor wafer can be smoothly separated without stress.

Since the semiconductor wafer is separated from the both-faced adhesive sheet in a posture that the device formation face protected with the both-faced adhesive sheet faces upward, the semiconductor wafer can be mounted as it is onto transport means and transported to the subsequent process. Therefore, a process of turning the separated semiconductor wafer upside down so that the device formation face faces upward becomes unnecessary and it also is advantageous from the viewpoint of improving carry efficiency.

In the semiconductor wafer separating method according to the present invention, in the first step, the supporting member is held in a posture that the surface of the supporting member faces upward, and in the second step, the semiconductor wafer is separated from the both-faced adhesive sheet whose adhesive strength is weakened while the back side of the semiconductor wafer is sucked.

According to the method, a semiconductor wafer is separated and drops by dead load and suction from the both-faced adhesive sheet whose adhesive strength is weakened, and the dropped semiconductor wafer can be properly received and held by the transport means. In this case, the separating stress by the dead load of the semiconductor wafer and suction acts from one end side of the both-faced adhesive sheet, and the semiconductor wafer can be smoothly separated without stress.

Since the semiconductor wafer is separated from the both-faced adhesive sheet in a posture that the device formation face protected with the both-faced adhesive sheet faces upward, the semiconductor wafer can be mounted as it is onto transport means and transported to the subsequent process. Therefore, a process of turning the separated semiconductor wafer upside down so that the device formation face faces upward becomes unnecessary and it is also advantageous from the viewpoint of improving carry efficiency.

Preferably, as the both-faced adhesive sheet, any of the following is used. For example, a both-faced adhesive sheet whose adhesive strength is weakened by heating or cooling may be used. In the first step, the both-faced adhesive sheet is heated or cooled. Another both-faced adhesive sheet is obtained by forming an adhesive layer having heating separability which is foamed and expanded when being heated and loses adhesion strength on at least any of the faces of a sheet base material. In the first step, the both-faced adhesive sheet is heated. Still another both-faced adhesive sheet is formed by sandwiching the sheet base material by adhesive layers of an ultraviolet curing type so that the adhesive layers loose their adhesive strengths at different wavelengths. In the first step, the both-faced adhesive sheet is irradiated with an ultraviolet ray.

In order to achieve the above object, the present invention also employs the following configuration:

An apparatus for separating a semiconductor wafer joined to a supporting member via a both-faced adhesive sheet whose adhesion strength is weakened by heating from the both-faced adhesive sheet, the apparatus comprising:

holding means for holding the supporting member;

heating means for heating the both-faced adhesive sheet joined to the held supporting member; and separating means for separating the semiconductor wafer from the both-faced adhesive sheet whose adhesive strength is weakened by heating in a non-contact manner.

In the semiconductor wafer separating apparatus according to the present invention, the both-faced adhesive sheet is heated by the heating means in a state where the supporting member side is held by the holding means. In a state where the adhesive strength of the heated both-faced adhesive sheet is weakened, the semiconductor wafer is separated by the separating means in a non-contact manner. Therefore, the semiconductor wafer separating method of the first aspect of the present invention can be suitably realized.

Preferably, the separating means separates the semiconductor wafer from the both-faced adhesive sheet while suspension-holding the semiconductor wafer in a non-contact manner by a differential pressure generated in a gap between the separating means and the face of the semiconductor wafer by ejecting gas toward the back face of the semiconductor wafer. Preferably, the holding means holds the surface side of the supporting member, and the separating means is a robot arm for suction-holding the back face of the semiconductor wafer. The robot arm is moved close to the back face of the semiconductor wafer to suck the semiconductor wafer, thereby separating the semiconductor wafer from the both-faced adhesive sheet and suction-holding the semiconductor wafer.

In order to achieve the above object, the present invention also employs the following configuration:

An apparatus for separating a semiconductor wafer joined to a supporting member via a both-faced adhesive sheet whose adhesion strength is weakened by cooling from the both-faced adhesive sheet, the apparatus comprising:

holding means for holding the supporting member;

cooling means for cooling the both-faced adhesive sheet joined to the held supporting member; and separating means for separating the semiconductor wafer in a non-contact manner from the both-faced adhesive sheet whose adhesive strength is weakened by cooling.

In the semiconductor wafer separating apparatus according to the present invention, in a state where the supporting member side is held by the holding means, the both-faced adhesive sheet is cooled by the cooling means. In a state where the adhesive strength of the cooled both-faced adhesive sheet is weakened, the semiconductor wafer is separated in a non-contact manner by the separating means. Therefore, the separating method of the first aspect of the present invention can be suitably realized.

Preferably, the separating means separates the semiconductor wafer from the both-faced adhesive sheet while suspension-holding the semiconductor wafer in a non-contact manner by a differential pressure generated in a gap between the separating means and the back face of the semiconductor wafer by ejecting gas toward the back face of the semiconductor wafer. Preferably, the holding means holds the supporting member in a posture that the surface of the supporting member faces upward, the separating means is a robot arm for suction-holding the back face of the semiconductor wafer, and the robot arm is moved close to the back face of the semiconductor wafer to suck the semiconductor wafer, thereby separating the semiconductor wafer from the both-faced adhesive sheet and suction-holding the semiconductor wafer.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Embodiments of the present invention will be described below with reference to the drawings.

First Embodiment

Figure 1:
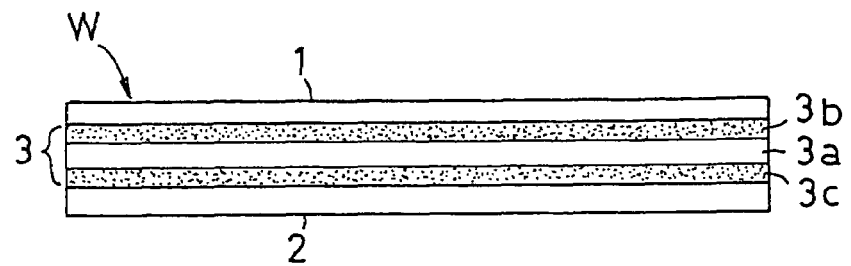
FIG. 1 is a side view of a work obtained by joining a supporting member to a semiconductor wafer.

FIG. 1 shows a work W obtained by joining a supporting member 2 taking the form of a glass plate to a device formation face (surface) of a semiconductor wafer 1 via a both-faced adhesive sheet 3. In a state where the back face of the semiconductor wafer 1 is backing-reinforced by the supporting member 2, the back face of the semiconductor wafer 1 is ground to a desired thickness in a back grinding process. After that, the semiconductor wafer 1 ground to be thin is separated from the both-faced adhesive sheet 3 and is subjected to the subsequent process.

The both-faced adhesive sheet 3 is constructed by providing adhesive layers 3b and 3c having heating separability which foam and expand when heated and loose adhesive strength on both sides of a sheet base material 3a. The adhesive layers 3b and 3c have different heat separating characteristics in such a manner that the adhesive strength of the adhesive layer 3b for adhesion holding the semiconductor wafer 1 almost disappears at about 70° C. and that of the adhesive layer 3c for adhesion holding the supporting member almost disappears at about 120° C.

A process of separating the semiconductor wafer 1 from the work W subjected to the back grind process will now be described with reference to FIGS. 2A and 2B.

Figure 2A:
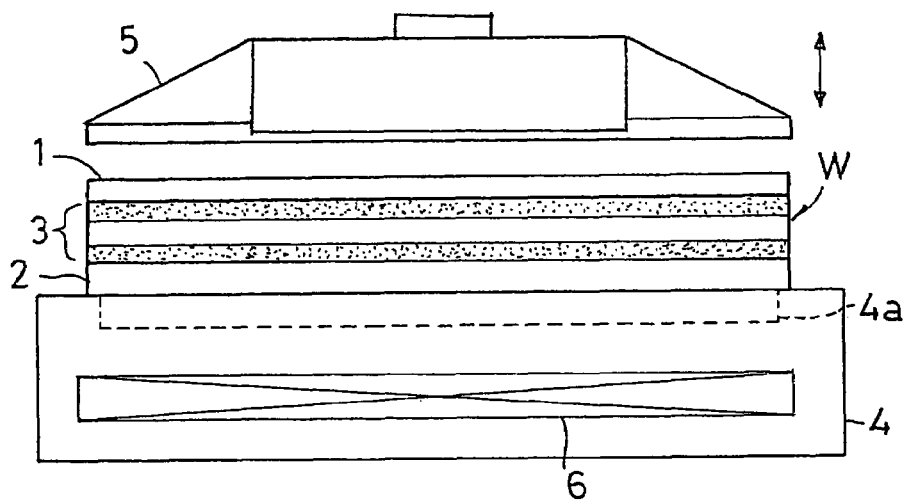
FIGS. 2A and 2B are side views each illustrating a separating process performed by separating means of a first embodiment.

As shown in FIG. 2A, first, the work W is loaded onto a suction chuck stage 4 in a posture that the back face of the semiconductor wafer 1 faces upward and is suction-held on the top face of the suction chuck stage 4 via a suction chuck part 4a from the surface side of the supporting member 2. A Bernoulli chuck 5 is disposed above the suction chuck stage 4 so as to be movable in the vertical and horizontal directions via driving means (not shown).

The Bernoulli chuck 5 ejects gas toward the work W, so that a differential pressure from the atmospheric pressure is generated in a gap between the Bernoulli chuck 5 and the face of the semiconductor wafer 1 by generation of a negative pressure by the ejector effect and the Bernoulli effect and generation of a positive pressure by an air cushion effect, thereby enabling an object positioned below the under face of the Bernoulli chuck 5 to be held in a state where the object floats in the air. Consequently, the Bernoulli chuck 5 is used to suspension-hold or carry an object in a non-contact manner.

The suction chuck stage 4 has therein a heater 6 and the work W is heated to a temperature at which the adhesive layer 3b on a low temperature side looses its adhesive strength. The Bernoulli chuck 5 is lowered to a height with a predetermined small interval to the top face of the work W, that is, the back facing upward of the semiconductor wafer 1 and a non-contact suspending action is exhibited by the gas ejecting operation. The small interval is properly changed and determined according to the shape and the weight after grinding of the semiconductor wafer 1 and the suspension holding capability of the Bernoulli chuck 5. In the case of this embodiment, for example, the small interval is set in a range from 0.1 to 1.0 mm.

Figure 2B:
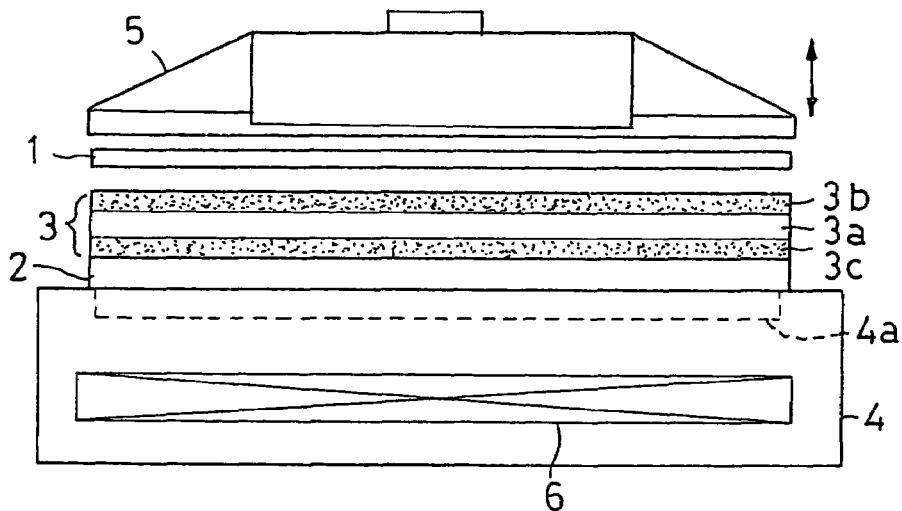

When the adhesive strength of the adhesive layer 3b disappears due to heating, the semiconductor wafer 1 receives suction force of the Bernoulli chuck 5, is separated from the both-faced adhesive sheet 3 and, as shown in FIG. 2B, suspension-held in the non-contact manner with the small interval from the under face of the Bernoulli chuck 5. At this time, the Bernoulli chuck 5 makes the positive and negative pressures act in order to suspension-hold the semiconductor wafer 1, thereby correcting the warp stress acting on the semiconductor wafer 1 at the time of grinding. That is, the warp stress on the semiconductor wafer 1 can be spread so as to disappear. By moving the Bernoulli chuck 5 while maintaining the state, the semiconductor wafer 1 is transported to a desired position.

With the configuration, the semiconductor wafer 1 can be separated in a non-contact manner in the state where the adhesive strength of the both-faced adhesive sheet 3 joining the supporting member 2 and the semiconductor wafer 1 is almost lost. Since small separating stress acting so as to be dispersed to the periphery of the semiconductor wafer 1 tends to act toward the center of the semiconductor wafer 1, the semiconductor wafer 1 is separated from the outer end side of the both-faced adhesive sheet toward the center. As a result, the stress caused by the separating on the semiconductor wafer 1 can be reduced and the semiconductor wafer 1 can be separated smoothly without stress while preventing warp and breakage of the semiconductor wafer 1.

By ejecting gas toward the work W by using the Bernoulli chuck 5, the differential pressure from the atmospheric pressure is generated in the gap between the Bernoulli chuck 5 and the face of the semiconductor wafer 1 by generation of a negative pressure due to the ejector effect and the Bernoulli effect and generation of a positive pressure due to the air cushion effect. Consequently, when an object positioned below the under face of the Bernoulli chuck 5 is suspension-held in a state where the object floats in the air, the object can be transported in a state where the warp stress generated when the semiconductor wafer 1 is ground is corrected so as to disappear. As a result, a problem such that when the semiconductor wafer 1 is loaded into a cassette or the like, an end portion of the semiconductor wafer 1 comes into contact with the cassette and is damaged due to a warp or the like can be also avoided.

Second Embodiment

In the first embodiment, since the device formation face of the separated semiconductor wafer 1 faces downward, the semiconductor wafer 1 has to be turned upside down before it is loaded to a processor of the subsequent process. In separating means to be described below, the turning process is unnecessary.

Figure 3A:
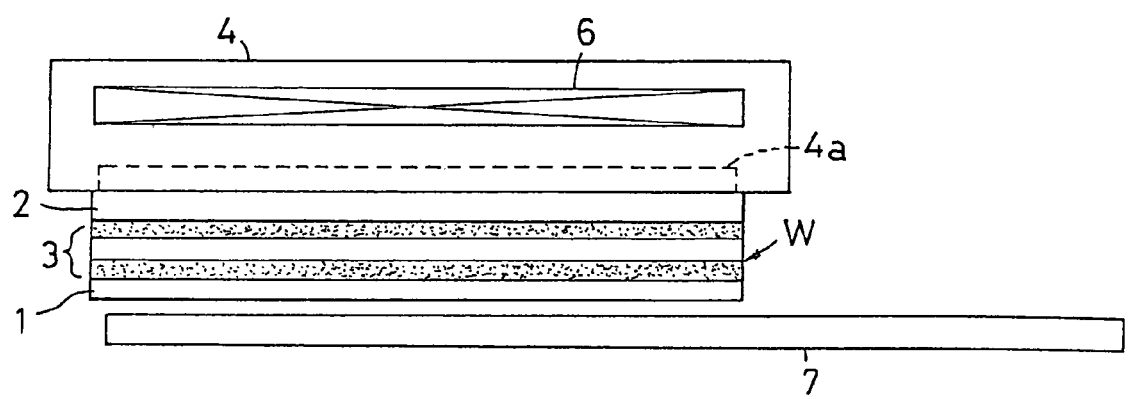
FIGS. 3A and 3B are side views each illustrating a separating process performed by separating means of a second embodiment.

As shown in FIG. 3A, in the separating means, first, the work W is loaded below the suction chuck stage 4 in a posture that the back face of the semiconductor wafer 1 faces downward, and is suction-held from the surface side of the supporting member 2 via the suction chuck part 4a by the under face of the suction chuck stage 4. A robot arm 7 as a transport arm having suction holes in its top face is disposed below the under face of the work W which is suction-held by the suction chuck stage 4, that is, the back side facing downward of the semiconductor wafer 1 with a predetermined small interval.

Figure 3B:
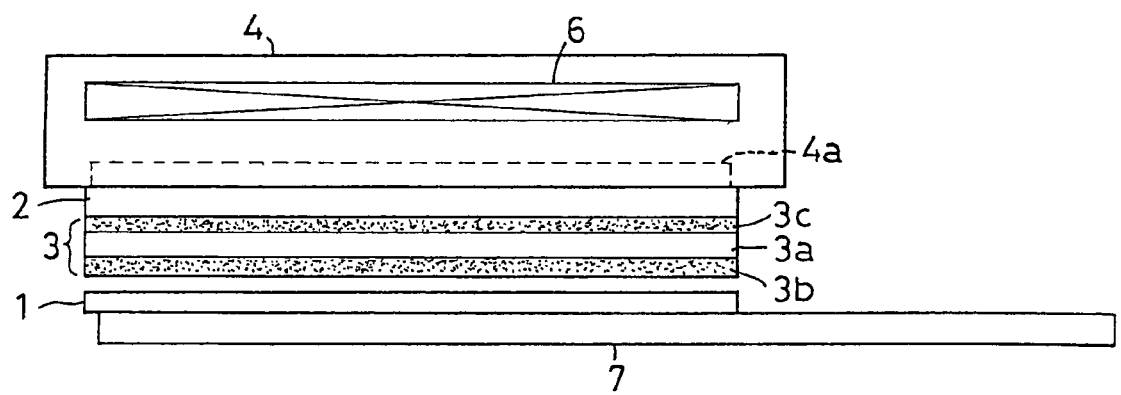

After that, the work W is heated by the heater 6 provided in the suction chuck stage 4. When the adhesive strength of the adhesive layer 3b almost disappears due to the heating, as shown in FIG. 3B, the semiconductor wafer 1 is separated and dropped from the both-faced adhesive sheet 3 by the dead load and the suction force of the robot arm 7 and received and held by the robot arm 7.

Since the device formation face of the semiconductor wafer 1 received and suction-held by the robot arm 7 faces upward, by moving the robot arm 7, the semiconductor wafer 1 can be loaded in the posture into the next processor, a housing member, or the like.

With the configuration, the semiconductor wafer 1 can be separated in a non-contact manner in the state where the adhesion strength of the both-faced adhesive sheet 3 joining the supporting member 3 and the semiconductor wafer 1 is almost disappeared. At this time, since small separating stress acting so as to be dispersed to the periphery of the semiconductor wafer 1 tends to act toward the center of the semiconductor wafer 1, the semiconductor wafer 1 is separated from the outer end side of the both-faced adhesive sheet toward the center. As a result, the stress caused by the separating on the semiconductor wafer 1 can be reduced and the semiconductor wafer 1 can be separated smoothly without stress while preventing warp and breakage of the semiconductor wafer 1.

The present invention is not limited to the foregoing embodiments but can be also modified as follows.

(1) In each of the foregoing embodiments, the semiconductor wafer 1 has the heating separability and is foamed and expanded when the adhesive layers 3a and 3b in the both-faced adhesive sheet 3 are heated to thereby lose their adhesion strengths. However, the present invention is not limited to the form. It is sufficient that the timings of loosing the adhesive strengths of the adhesive layers 3b and 3c are different from each other.

For example, it is sufficient to use the adhesive layer 3c on the supporting member side whose adhesive strength is reduced by making the adhesive layer 3c cured by being irradiated with an ultraviolet ray, and to combine the adhesive layer 3c with an adhesive layer having a different condition of loosing the adhesive strength. Alternatively, the adhesive layers 3b and 3c of the ultraviolet curing type can be also used. In this case, it is sufficient to combine adhesive layers of ultraviolet curing type so that their adhesive strengths are lost at different wavelengths. Further, the adhesive strengths of the adhesive layers 3b and 3c may be lost by cooling. In this case, it is sufficient to make temperatures at which the adhesive strengths are lost of the adhesive layers 3b and 3c different from each other.

In the case of using the both-faced adhesive sheets whose adhesive strengths are lost by cooling, it is sufficient to construct an apparatus as follows.

For example, in the case of using the apparatus of the first or second embodiment, as a first form, in place of the heater 6 provided in the suction chuck stage 4, a cooling medium is circulated in the suction chuck stage. As a second form, it is sufficient to blow cold wind toward the work W held on the suction chuck stage 4.

(2) Although the semiconductor wafer 1 is separated while sucking the back face of the semiconductor wafer 1 by the robot arm 7 in the second embodiment, suction may be stopped and the semiconductor wafer 1 dropped by the dead load may be received.

(3) Although the semiconductor wafer 1 is completely separated from the both-faced adhesive sheet 3 in each of the foregoing embodiments, the following forms may be also employed. In a state where the adhesive layer 3b and the sheet base material 3a of the both-faced adhesive sheet are left on the surface side of the semiconductor wafer 1 and the adhesive layer 3c of the supporting member 2 is left, the semiconductor wafer 1 may be separated. In this case, the adhesive sheet remaining on the semiconductor wafer 1 side can function as a surface protection sheet.

In the case where the adhesive sheet is left as the surface protection sheet as described above, the surface protection sheet is separated by using a surface protection sheet separating mechanism.

In this case, a separating sheet is joined onto the surface of the adhesive sheet via a separating bar, a separating roller, or the like and, after that, the adhesive sheet integrated with the separating sheet can be separated from the surface of the semiconductor wafer 1. Thus, the adhesive sheet can be effectively separated from the surface of the semiconductor wafer 1 in a state where unnecessary remaining is almost eliminated.

The present invention may be embodied in other specific forms without departing from the spirit or essential attributes thereof and, accordingly, reference should be made to the appended claims, rather than to the foregoing specification, as indicating the scope of the invention.

What is claimed is:

1. A method for separating a semiconductor wafer joined to a supporting member via a both-faced adhesive sheet from the both-faced adhesive sheet, the method comprising:
    a first step of weakening adhesive strength of the both-faced adhesive sheet for joining the semiconductor wafer and the supporting member to each other in a state where the supporting member is held in a posture that a surface of the supporting member faces downward and a space is formed between a back face of the semiconductor wafer and separating means; and
    a second step of separating the semiconductor wafer from the both-faced adhesive sheet while weakening the adhesive strength of the both-faced adhesive sheet and afflicting and suspension-holding the semiconductor wafer in a non-contact manner by a differential pressure generated in a gap between the separating means and the back face of the semiconductor wafer by ejecting gas from the separating means toward the back face of the semiconductor wafer, and of leaving all of the both-faced adhesive sheet on the supporting member.

2. The method according to claim 1, wherein
    the adhesion strength of the both-faced adhesive sheet is weakened by heating or cooling and, in the first step, the both-faced adhesive sheet is heated or cooled.

3. The method according to claim 2, wherein
    the both-faced adhesive sheet is obtained by forming an adhesive layer having heating separability which is foamed and expanded when being heated and loses adhesion strength on at least any of the faces of a sheet base material, and in the first step, the both-faced adhesive sheet is heated.

4. The method according to claim 1, wherein the both-faced adhesive sheet is formed by sandwiching the sheet base material by adhesive layers of an ultraviolet curing type so that the adhesive layers loose their adhesive strengths at different wavelengths, and in the first step, the both-faced adhesive sheet is irradiated with an ultraviolet ray.

5. The method according to claim 1, wherein the adhesion strength of the both-faced adhesive sheet is weakened by heating and, in the first step, the both-faced adhesive sheet is heated.

6. The method according to claim 5, wherein the both-faced adhesive sheet is obtained by forming an adhesive layer having heating separability which is foamed and expanded when being heated and loses adhesion strength on at least any of the faces of a sheet base material, and in the first step, the both-faced adhesive sheet is heated.

7. A method for separating a semiconductor wafer joined to a supporting member via a both-faced adhesive sheet from the both-faced adhesive sheet, the method comprising:

a first step of weakening adhesive strength of the both-faced adhesive sheet for joining the semiconductor wafer and the supporting member to each other in a state where the supporting member is held in a posture that a surface of the supporting member faces upward; and a second step of separating the semiconductor wafer from the both-faced adhesive sheet whose adhesive strength is weakened while the back side of the semiconductor wafer is sucked, and holding the separated semiconductor wafer in a state where the semiconductor wafer is lifted upward in a non-contact manner by a differential pressure generated in a gap between a separating means and the back surface of the wafer by ejecting a gas from the separating means toward the back face of the wafer while the supporting member is held, and of leaving all of the both-faced adhesive sheet on the supporting member.

8. The method according to claim 7, wherein the adhesion strength of the both-faced adhesive sheet is weakened by heating and, in the first step, the both-faced adhesive sheet is heated.

9. The method according to claim 8, wherein the both-faced adhesive sheet is obtained by forming an adhesive layer having heating separability which is foamed and expanded when being heated and loses adhesion strength on at least any of the faces of a sheet base material, and in the first step, the both-faced adhesive sheet is heated.

10. The method according to claim 7, wherein the both-faced adhesive sheet is formed by sandwiching a sheet base material by adhesive layers of an ultraviolet curing type so that the adhesive layers lose their adhesive strength at different wavelengths and, in the first step, the both-faced adhesive sheet is irradiated with an ultraviolet ray.

* * * * *